(12) United States Patent
Fan

(10) Patent No.: US 7,845,964 B2
(45) Date of Patent: Dec. 7, 2010

(54) SOCKET CONNECTOR WITH LOAD PLATE HAVING LOCKING TABS ENGAGED WITH STIFFENER

(75) Inventor: Chia-Wei Fan, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/625,569

(22) Filed: Nov. 25, 2009

(65) Prior Publication Data

US 2010/0130048 A1 May 27, 2010

(30) Foreign Application Priority Data

Nov. 25, 2008 (TW) .............................. 977221048 U

(51) Int. Cl.
*H01R 13/62* (2006.01)

(52) U.S. Cl. ......................................... 439/331; 439/73

(58) Field of Classification Search .................. 439/70, 439/71, 73, 330, 331, 342

See application file for complete search history.

(56) References Cited

U.S. PATENT DOCUMENTS

| 7,153,154 | B2  |   | 12/2006 | Ma et al. |         |
|-----------|-----|---|---------|-----------|---------|
| 7,182,620 | B1  | * | 2/2007  | Ju        | 439/331 |
| 7,234,955 | B1  | * | 6/2007  | Ho        | 439/331 |
| 7,275,950 | B1  | * | 10/2007 | Ma et al. | 439/342 |
| 7,744,396 | B2  | * | 6/2010  | Taguchi et al. | 439/331 |

* cited by examiner

*Primary Examiner*—Thanh-Tam T Le
(74) *Attorney, Agent, or Firm*—Andrew C. Cheng; Wei Te Chung; Ming Chieh Chang

(57) ABSTRACT

An electrical connector (100) comprising an insulative housing (3) with a plurality of contacts (5) received therein, a stiffener (4) surrounding the insulative housing (3) and a load plate (1), the stiffener (4) comprises a front end (41) and a rear end (42) opposite to the front end (41), the load plate (1) comprises a rear end (12) pivotally attached to the stiffener (4) and a front end (11) opposite to the rear end (12), an interlock means is defined on the front ends (11, 41) of the load plate (1) and the stiffener (4) to prevent the movement of the load plate (1) in the horizontal direction.

7 Claims, 4 Drawing Sheets

SOCKET CONNECTOR WITH LOAD PLATE HAVING LOCKING TABS ENGAGED WITH STIFFENER

BACKGROUND OF THE INVENTION

1. Field of the Invention

The present invention relates to a socket connector, and more particularly, to a socket connector having a load plate engaged to a stiffener when the load plate is closed to the stiffener and retained thereto by a cam of a lever.

2. Description of the Prior Art

U.S. Pat. No. 7,153,154 issued to Ma on Dec. 26, 2006 discloses a conventional electrical connector for electrically connecting a CPU (Central Process Unit) with a PCB (Printed Circuit Board). The electrical connector comprises an insulative housing with a number of terminals received therein, a stiffener attached to the insulative housing, a load plate and a load lever pivotally mounted to two ends of the stiffener respectively. The load plate comprises a body plate having a window in the middle thereof and a pressing side with an interlocking element extending forwardly from the body plate. The body plate defines a pair of press points near the window for pressing the CPU. The load lever is formed by bending a single metallic wire and includes a pair of rotary shafts, a locking section disposed between the rotary shafts and an actuating section for rotating the rotary shafts. The actuating section is bent at a right angle with respect to the rotary shafts.

When the CPU is assembled to the insulative housing, the load plate is rotated to a closed position and the locking section of the lever press the interlocking element of the load plate. Thus the press portion of the load plate exerts a force on the CPU to make a good electrical connection between the CPU and the terminals of the electrical connector.

Since the load plate tends to move along the horizontal direction, the position in which the load plate acts on the CPU is varied, creating a tilt of the CPU is the acting point is not in a center of the CPU.

In view of the above, a new electrical connector that overcomes the above-mentioned disadvantages is desired.

SUMMARY OF THE INVENTION

Accordingly, an object of the present invention is to provide an electrical connector having locking device to make the load plate press on the CPU in a certain region.

To fulfill the above-mentioned object, an electrical connector comprises an insulative housing with a plurality of contacts received therein, a stiffener surrounding the insulative housing and a load plate, the stiffener comprises a front end and a rear end opposite to the front end, the load plate comprises a rear end pivotally attached to the stiffener and a front end opposite to the rear end, an interlock means is defined on the front ends of the load plate and the stiffener to prevent the movement of the load plate in the horizontal direction.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
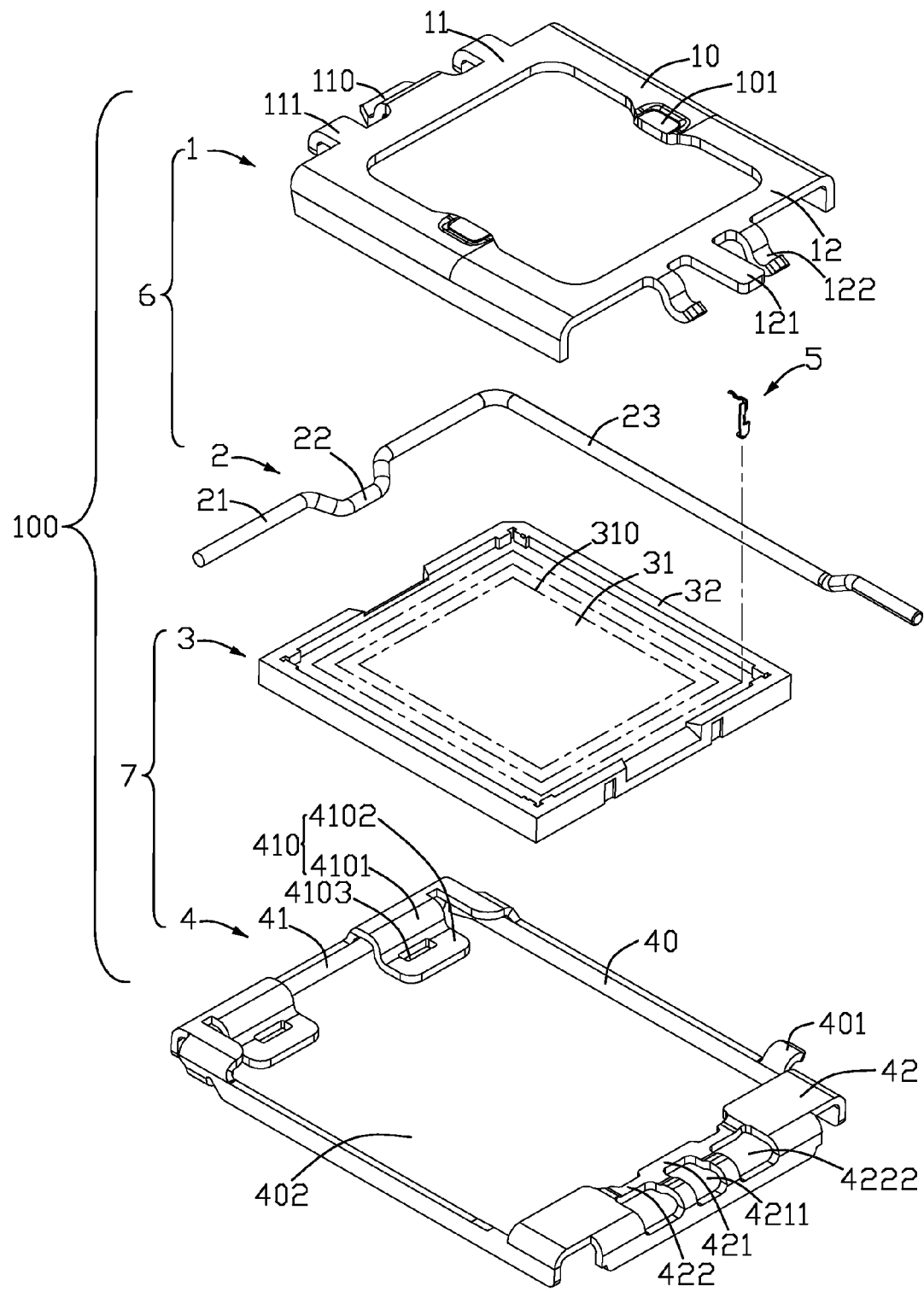
FIG. 1 is an exploded view of an electrical connector in accordance with the preferred embodiment of the present invention.
Figure 2:
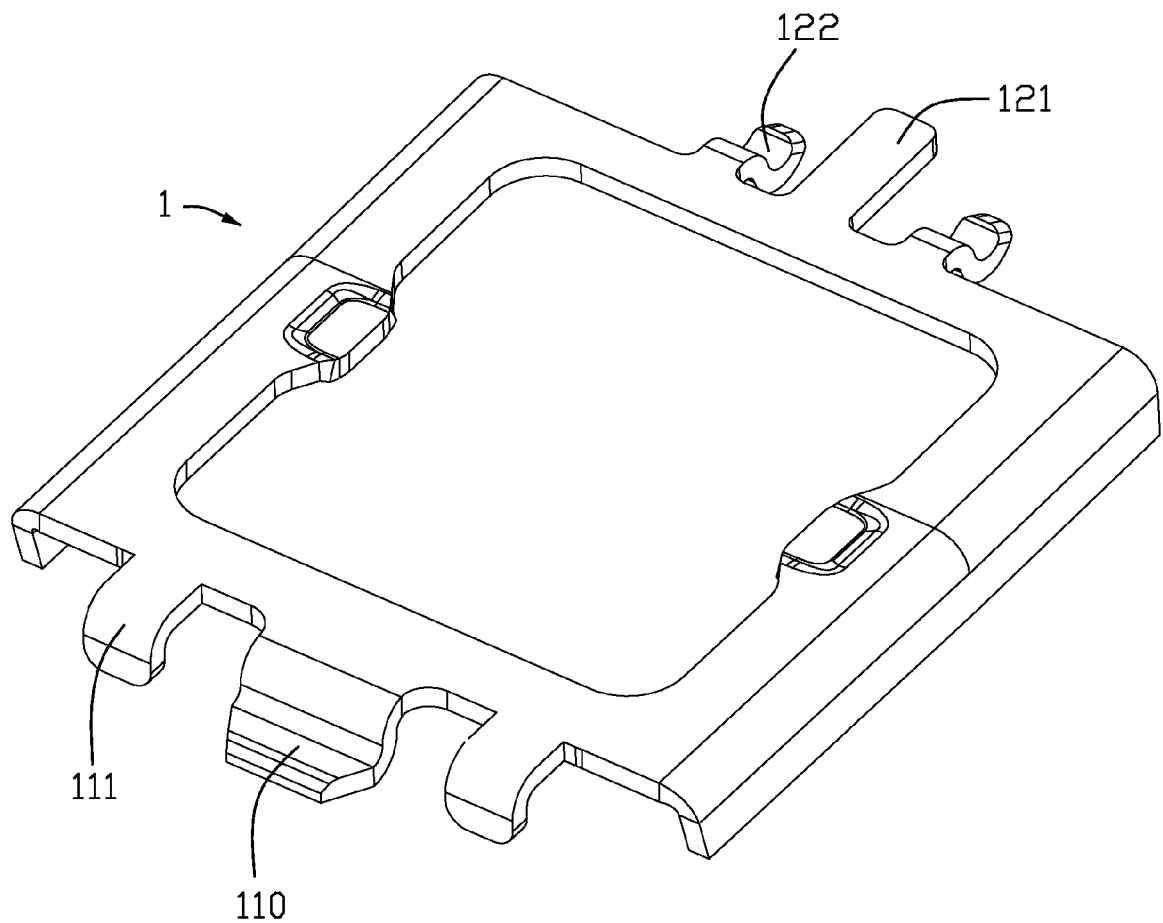
FIG. 2 is an isometric view of the load plate of the electrical connector in FIG. 1.

Referring to FIGS. 1-2, an electrical connector 100 in accordance with the present invention is used to electrically connecting a CPU (Central Process Unit) with a PCB (Printed Circuit Board). The electrical connector 100 comprises a housing assembly 7 with a plurality of contacts 5 received therein and a press assembly 6 attached to the housing assembly 7. The housing assembly 7 comprises an insulative housing 3 and a stiffener 4 surrounding the insulative housing 3. The press assembly 6 comprises a load plate 1 attached to a rear end 42 of the stiffener 4 and a load lever 2 attached to a front end 41.

The insulative housing 3 is configured to a rectangular shape and comprises a bottom wall 31, four sidewalls 32 extending upwardly from the bottom wall 31 and a receiving space 310 formed by the bottom wall 31 and the sidewalls 32. The receiving space 310 is used to receive the CPU. The contacts 5 are received in the bottom wall 31 with a contact portion (not labeled) located in the receiving space 310 for electrically connecting with the CPU.

The stiffener 4 is configured to a rectangular shape and comprises a pair of first sidewalls 40 connecting the front end 41 and the rear end 42. The two first sidewalls 40, the front end 41 and the rear end 42 form a window 402 to receive the insulative housing 3. One of the first sidewalls 40 defines a locking element 401. The front end 41 defines a pair of lock slices 410 extending to the window 402. The lock slice 410 comprises an arc portion 4101 extending upwardly and then extending curvedly to the second end 42 from the first end 41, and a plate portion 4102 extending in a front to back direction from the arc portion 4101. There is a slot 4103 impenetrate the plate portion 4102. The rear end 42 comprises a support portion 421, a pair of interlock portions 422 positioned on the two sides of the support portion 421, a hole 4211 corresponding to the support portion 421 and an aperture 4222 corresponding to the interlock portion 422.

The load plate 1 is pivotally attached to the second end 42 of the stiffener 4 and comprises a rear end 12 attached to the stiffener 4, a front end 11 opposite to the rear end 12 and a pair of connecting portions 10 connecting the rear end 12 and the front end 11. A pair of hooks 122 and an anti-rotation bar 121 extend from the rear end 12. The hooks 122 are interlocked with the interlock portions 422 and partly located in the aperture 4222 to make the hooks 122 to rotate about the interlock portions 422 from an opened position to a closed position. The anti-rotation bar 121 is located on the support portion 421 and can rotate about the support portion 421, and one part of the anti-rotation bar 121 is positioned in the hole 4211. A tongue portion 110 and a pair of locking portions 111 are extending from the front end 11. The locking portion 111 is extending forwardly in the horizontal direction and then downwardly in the vertical direction from the front end 11. The tongue portion 110 is located in the middle of the pair of the locking portions 111. The connecting portions 10 each defines a press portion 101 for pressing the CPU.

The load lever 2 comprises a handle 23 and a cam 21 perpendicular to the handle 23. The cam 21 is interlocked with the arc portion 4101 of the lock slice 410 of the stiffener 4 and defines a middle engage portion 22 for pressing the tongue portion 110 of the load plate 1, whereby make the load plate 1 press the CPU to establish an electrically connection between the CPU and the contacts 5.

Figure 3:
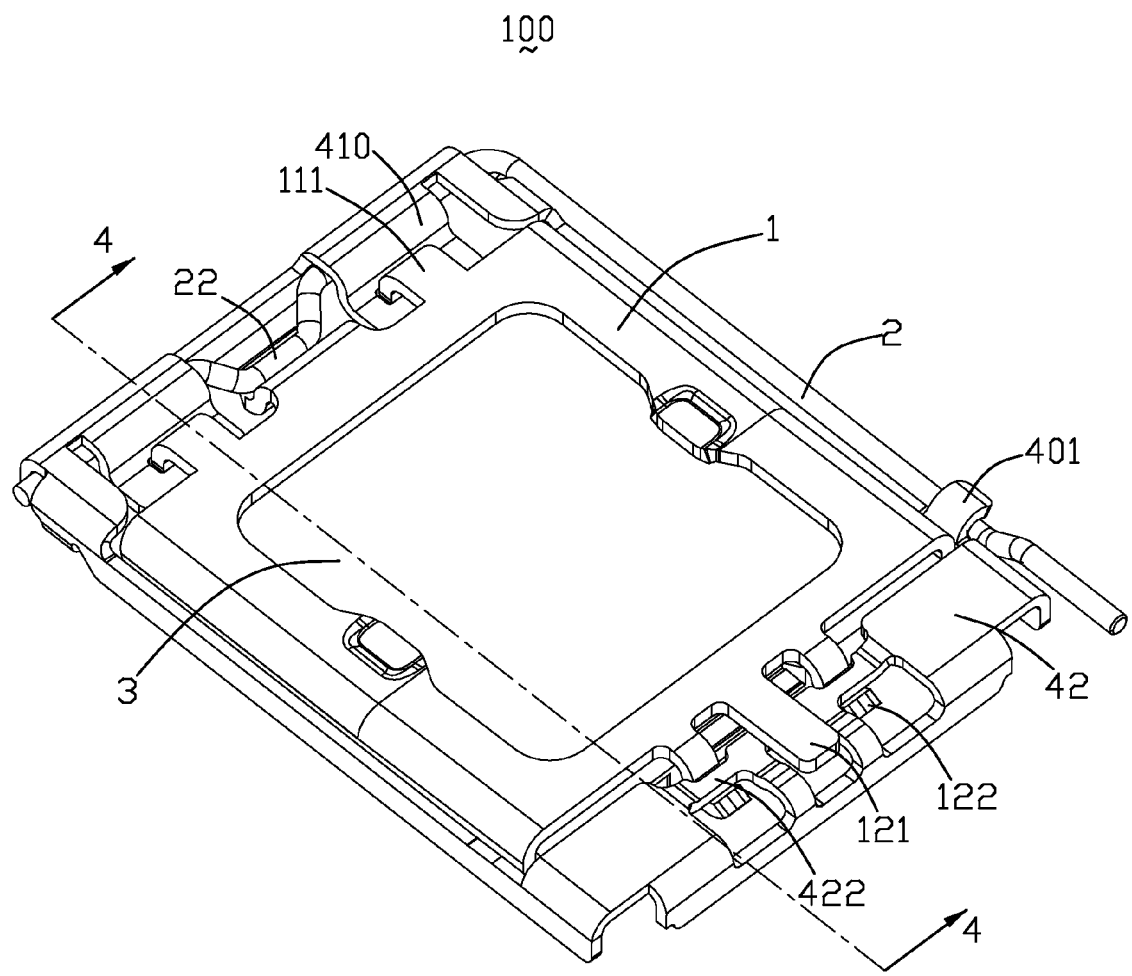
FIG. 3 is an assembled view of FIG. 1, showing the load plate at a closed position.
Figure 4:
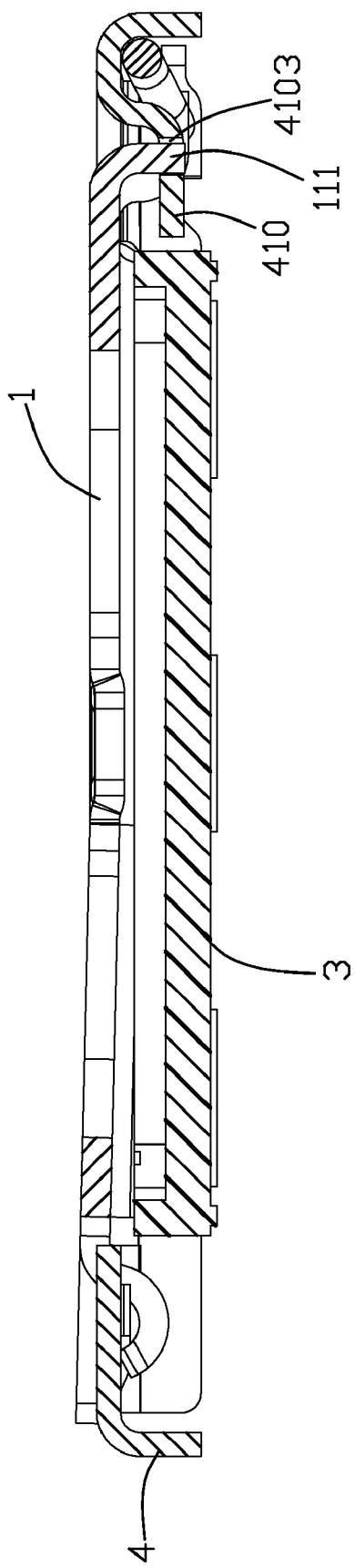
FIG. 4 is a cross-sectional view of FIG. 3 taken along the line 4-4, showing the hook of the load plate interlocked with the stiffener.

Referring to FIGS. 3-4, after the electrical connector 100 is assembled, the insulative housing 3 is received in the window 402 of the stiffener 4, the load plate 4 is pivotally attached to the rear end 42 and the load lever 2 is pivotally attached to the front end 41.

When the electrical connector 100 is in used, the CPU is assembled to the insulative housing 3. The load plate 1 is then rotated downwardly to the closed position and the operation lever 23 of the load lever 2 is interlocked with the locking element 401 of the stiffener 4 so that the load lever 23 presses the tongue portion 110 steadily. When the load lever 2 is actuated to press the tongue portion 110 of the load plate 1 downwardly, the locking portions 111 are located in the slot 4103 to make the load plate 1 has limited movement in the horizontal direction. Thus, the press portion 101 can press the CPU in a certain region, which ensures a better electrical connection between the CPU and contacts 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
    an insulative housing with a plurality of contacts received therein;
    a stiffener surrounding the insulative housing and having a front end and a rear end; and
    a load plate comprising a rear end pivotally attached to the stiffener and a front end opposite to the rear end;
    wherein interlock means is defined on the front ends of the load plate and the stiffener to prevent the movement of the load plate in a horizontal direction;
    wherein the interlock means includes a pair of locking portions extending forwardly and then downwardly from the front end of the load plate;
    wherein the interlock means includes a slot defined on the stiffener to engage with the locking portions of the load plate;
    wherein the stiffener has a pair of slices thereon;
    wherein the slice comprises an arc portion extending upwardly and then curvedly from the front end of the stiffener and a plate portion extending backwardly from the arc portion; and
    wherein the slot is defined on the plate portion.

2. The electrical connector as claimed in claim 1, wherein the load plate comprises a tongue portion extending from the front end.

3. The electrical connector as claimed in claim 2, wherein the electrical connector comprises a press lever attached to the arc portion of the slice and interlocked with the tongue portion to position the load plate in a closed position.

4. An electrical connector comprising:
    an insulative housing with a plurality of contacts received therein;
    a stiffener surrounding the insulative housing; and
    a load plate rotating relative to the stiffener from an opened position to a closed position and comprising a rear end pivotally attached to the stiffener, a front end opposite to the rear end;
    wherein the stiffener comprises a stop portion to engage with the front end of the load plate to limit the movement of the load plate in a horizontal direction;
    wherein the stop portion is a slice comprising an arc portion extending upwardly and then curvedly from the front end of the stiffener and a plate portion extending backwardly from the arc portion;
    wherein there is a slot defined on the plate portion; and
    wherein the load plate comprises a pair of locking portions extending forwardly and then downwardly from the front end, and the locking portions engaged with the slot of the stiffener.

5. The electrical connector as claimed in claim 4, wherein the load plate comprises a tongue portion extending from the front end.

6. The electrical connector as claimed in claim 5, wherein the electrical connector comprises a press lever attached to the arc portion of the slice and interlocked with the tongue portion to position the load plate in a closed position.

7. A socket connector, comprising:
    a stiffener defining a window therein, and having front and rear ends thereof, the rear end defining at least a slot therein;
    a load plate rotationally assembled to the rear end of the stiffener, and including a tab with at least one latch arranged adjacent to the tab and engageable to the slot of the stiffener;
    a lever rotationally assembled to the second end of the stiffener and including a cam portion depressing the tab of the load plate when the load plate is closed to the stiffener; and
    a connector housing disposed within the window;
    wherein the stiffener comprises a slice extending from the front end;
    wherein the slice comprises an arc portion extending upwardly and then curvedly from the front end of the stiffener and a plate portion extending backwardly from the arc portion; and
    wherein the slot is defined on the plate portion.

* * * * *